(12) United States Patent
Matheson

(10) Patent No.: US 7,348,604 B2
(45) Date of Patent: Mar. 25, 2008

(54) LIGHT-EMITTING MODULE

(75) Inventor: George E. Matheson, North Vancouver (CA)

(73) Assignee: TIR Technology LP, Burnaby, British Columbia (CA)

( * ) Notice: Subject to any disclaimer, the term of this patent is extended or adjusted under 35 U.S.C. 154(b) by 0 days.

(21) Appl. No.: 11/419,292

(22) Filed: May 19, 2006

(65) Prior Publication Data

US 2006/0284199 A1   Dec. 21, 2006

Related U.S. Application Data

(60) Provisional application No. 60/683,244, filed on May 20, 2005.

(51) Int. Cl.
    *H01L 29/22*  (2006.01)
    *H01L 29/24*  (2006.01)
    *H01L 33/00*  (2006.01)

(52) U.S. Cl. ............... 257/98; 257/99; 257/100; 257/678; 257/680; 257/684; 257/706; 257/707; 257/718; 257/E23.086; 257/E23.088; 257/E23.103; 257/E25.032

(58) Field of Classification Search ............ 257/81, 257/83, 98–100, 116, 177, 431–433, 678–733, 257/E23.001–E23.194, E25.032
    See application file for complete search history.

(56) References Cited

U.S. PATENT DOCUMENTS

| | | | |
|---|---|---|---|
| 4,267,559 A | * | 5/1981 | Johnson et al. ............. 257/99 |
| 5,262,675 A | * | 11/1993 | Bausman, Jr. ............. 257/714 |
| 6,394,626 B1 | | 5/2002 | McColloch |
| 6,558,021 B2 | | 5/2003 | Wu |
| 6,660,935 B2 | | 12/2003 | Southard |
| 6,712,486 B1 | | 3/2004 | Popovich |
| 6,812,637 B2 | | 11/2004 | Cok |
| 6,837,598 B2 | | 1/2005 | Marcus |
| 2003/0058650 A1 | * | 3/2003 | Shih ......................... 362/294 |
| 2003/0063463 A1 | | 4/2003 | Sloan |
| 2005/0045902 A1 | | 3/2005 | Ng |
| 2005/0053336 A1 | * | 3/2005 | Ito et al. ..................... 385/89 |
| 2005/0077616 A1 | | 4/2005 | Ng |
| 2005/0022165 A1 | | 10/2005 | Mrakovich |
| 2005/0221659 A1 | | 10/2005 | Mrakovich |

FOREIGN PATENT DOCUMENTS

JP    1142321    5/1999

* cited by examiner

*Primary Examiner*—Jasmine Clark
(74) *Attorney, Agent, or Firm*—Harold L. Marquis; George M. Thomas; James W. Kayden

(57) ABSTRACT

The light-emitting module according to the present invention comprises a heat dissipation element, a substrate for example a metal core printed circuit board (MCPCB), or FR4 board which is coupled to one or more light-emitting elements and provides a means for operative connection of the light-emitting elements to a source of power. The substrate is positioned such that it is thermally coupled to the heat dissipation element. The light-emitting module further comprises a housing element which matingly connects with the heat dissipation element, wherein the housing element may further comprise an optical element integrated therein for manipulation of the light generated by the one or more light-emitting elements.

15 Claims, 5 Drawing Sheets

LIGHT-EMITTING MODULE

FIELD OF THE INVENTION

The present invention pertains to the field of lighting systems and in particular to a light-emitting module with versatile electromechanical mounting, connecting, and assembly capabilities.

BACKGROUND

Advances in the development and improvements of the luminous flux of light-emitting devices such as semiconductor, organic or polymer light-emitting diodes (LEDs) have made these devices suitable for use in general illumination applications, including architectural, entertainment, and roadway lighting, for example. As such, LEDs are becoming increasingly competitive with light sources such as incandescent, fluorescent, and high-intensity discharge lamps.

LEDs offer a number of advantages and are generally chosen for their ruggedness, long lifetime, high efficiency, low voltage requirements, and the possibility to control the colour and intensity of the emitted light independently. They provide an improvement over delicate gas discharge lamp, incandescent bulb, and fluorescent lighting systems. Solid state lighting sources have the capability to create the same lighting impressions but outweigh the drawbacks associated with the other lighting technologies.

In addition, the lighting industry has introduced ever less complicated and more standardized modular lighting components. Requirements for a vast diversity of shapes and forms of lit characters and symbols, for example, still necessitate the assembly of individually manufactured and relatively expensive letter dies in order to enable the required lighting effects. From a practical standpoint, a type of lighting technology would be desirable that allows building a solution with simpler more generic modular elements.

A number of literature references disclose light-emitting module designs for use in lighting and illumination apparatuses. For example, U.S. Pat. No. 6,837,598 describes a lighting device having a three-way conductor strip with three conductors extending in an axial direction and electrically connected at intervals to LED elements arranged in a row. Each LED element is in a plastic housing which surrounds the LED and the conductor strip, and the housing may have a lens over the LED. The housing includes two shells fixed together, and with supporting elements for an LED element, an adjacent axial conductor strip area and a heat activatable electrically conductive material. This lighting device however, does not provide a means for dissipating heat generated by the LED elements.

U.S. Pat. No. 6,660,935 describes an LED light engine which includes an electrical conductor, a flexible, electrically insulating covering surrounding the electrical conductor, and an LED. The electrical conductor includes a plurality of conductive elements. A connector is mechanically secured to the flexible insulating covering and electrically contacts the electrical conductor. The LEDs include a plurality of electrical leads, one pair of which connects the LED to a power source. Dissipation of heat generated by the LEDs is achieved using additional electrical leads. The light engine however does not provide a means for protecting the LED from the environment.

U.S. Pat. No. 6,394,626 describes an outdoor lighting display using LEDs. A flexible light track is secured at the bottom of a channel, e.g. a letter or symbol. A top corresponding to the shape of the channel covers the channel to protect the flexible light track from weather changes. The flexible light track includes a plurality of plastic modules having electrical connectors and respective tracks. LEDs are inserted in the plastic modules. Electrical wires are positioned in the tracks of the plastic modules such that the LEDs are electrically solely connected in parallel.

U.S. Patent Application Publication No. 2005/0221659 describes an LED light engine that includes a flexible electrical cable, a wire-socket assembly attached to the cable, and an LED module selectively attached to the wire-socket assembly. The wire-socket assembly includes at least two IDC terminals. The IDC terminal displaces the insulating covering of the cable and contacts one of the electrical conductors. The LED module includes an LED electrically connected to the IDC terminals when the LED module attaches to the wire-socket assembly.

U.S. Pat. No. 6,558,021 discloses LED based light-emitting modules for illuminating signs. For this configuration, however, each module requires a complicated housing that provides mechanical and electrical functionality.

The removal of heat from LEDs can lead to an increase in their longevity and brightness. A modular LED system with heat removal elements is disclosed in U.S. Pat. No. 6,712,486, for example. This patent discloses a modular LED mounting configuration including a thermally conductive body for removing heat generated by the LEDs to an adjacent heat sink. The LED module comprises a plurality of LED packages and a circuit board. The circuit board comprises electrically conductive contacts, with each contact configured to mount a lead from an LED package such that the LEDs are connected in series. A problem with this configuration is that soldering and potentially cutting of the leads are required which can be time consuming and cumbersome during installation.

U.S. Patent Application Publication No. 2003/0063463 discloses a modular LED lighting system for use in channel letter signs and lighting systems. Each module in this invention provides a thermally conductive extrusion, a printed circuit board with light-emitting devices, input and optional output wires with a combination of releasable male and female connectors. The module however, does not comprise any optical elements. In addition, a predetermined wiring length and the use of the thermally conductive extrusion to mechanically mount the module can require extra parts which can make the overall design more complicated and potentially less cost effective.

While there are many designs of light-emitting modules that facilitate heat sinking with relatively easy wiring, the prior art designs may not be simple enough to improve manufacturing, simplify assembly, and provide ease of maintenance. Therefore, there is a need for a new lighting module that provides optical, mechanical, electrical, and thermal functionality and electromechanical connectivity in a modular form.

This background information is provided to reveal information believed by the applicant to be of possible relevance to the present invention. No admission is necessarily intended, nor should be construed, that any of the preceding information constitutes prior art against the present invention.

SUMMARY OF THE INVENTION

An object of the present invention is to provide a light-emitting module. In accordance with an aspect of the present invention, there is provided a light-emitting module comprising: a thermally conductive substrate having one or more light-emitting elements thermally connected thereto, the substrate configured to operatively couple a source of power to the one or more light-emitting elements, thereby providing a means for activation of the one or more light-emitting elements; a heat dissipation element thermally coupled to the thermally conductive substrate; and a housing element including fastening means for detachably coupling the housing element to the heat dissipation element, said substrate being enclosed between the heat dissipation element and said housing element, said housing element including a transparent region enabling transmission of light emitted by the one or more light-emitting elements therethrough.

DETAILED DESCRIPTION OF THE INVENTION

Definitions

Figure 1:
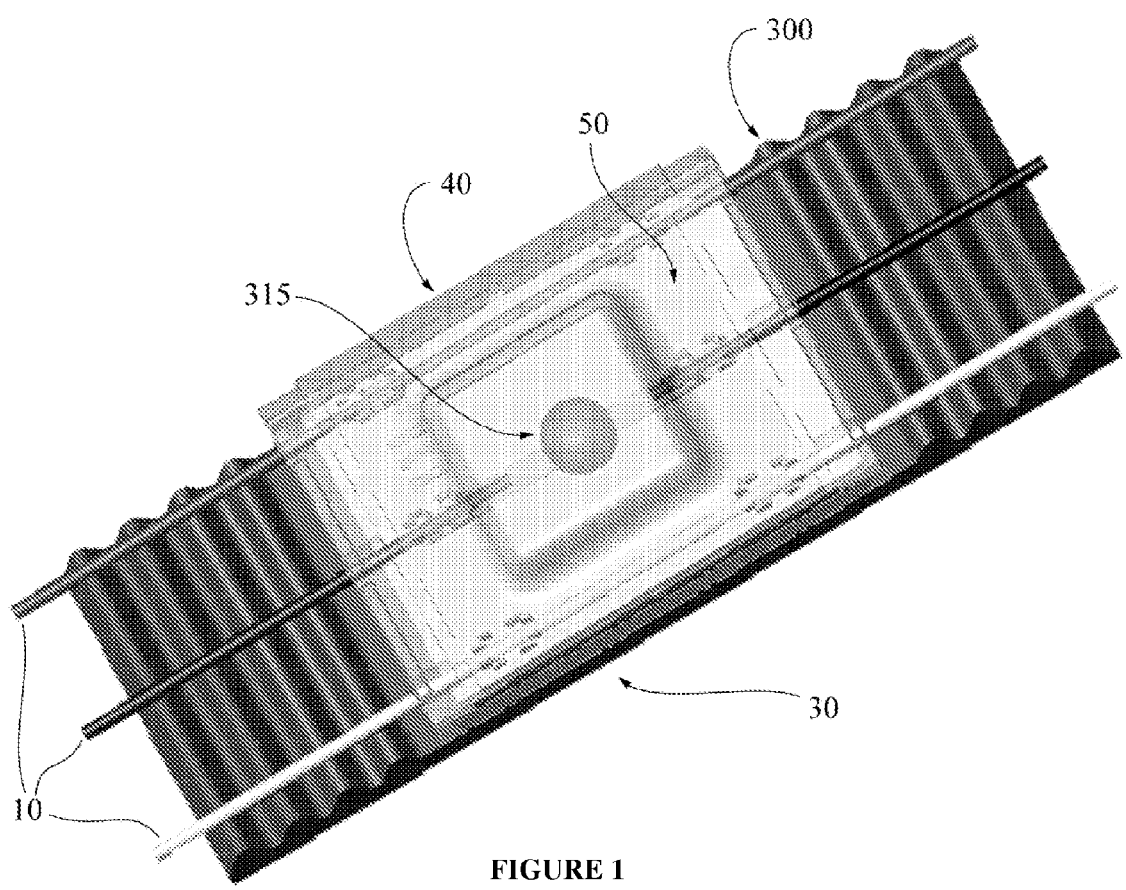
FIG. 1 illustrates the light-emitting side of a light-emitting module according to one embodiment of the present invention.

The term "light-emitting element" is used to define any device that emits radiation in any region or combination of regions of the electromagnetic spectrum for example, the visible region, infrared and/or ultraviolet region, when activated by applying a potential difference across it or passing a current through it, for example. Therefore a light-emitting element can have monochromatic, quasi-monochromatic, polychromatic or broadband spectral emission characteristics. Examples of light-emitting elements include semiconductor, organic, or polymer/polymeric light-emitting diodes, optically pumped phosphor coated light-emitting diodes, optically pumped nano-crystal light-emitting diodes or any other similar light-emitting devices as would be readily understood by a worker skilled in the art. Furthermore, the term light-emitting element is used to define the specific device that emits the radiation, for example a LED die, and can equally be used to define a combination of the specific device that emits the radiation together with a housing or package within which the specific device or devices are placed.

As used herein, the term "about" refers to a +/−10% variation from the nominal value. It is to be understood that such a variation is always included in any given value provided herein, whether or not it is specifically referred to.

Unless defined otherwise, all technical and scientific terms used herein have the same meaning as commonly understood by someone of ordinary skill in the art to which this invention belongs.

The present invention provides a light-emitting module that enables heat dissipation from the light-emitting elements, protection of the light-emitting elements and other components within the module from environmental conditions, ease of connection of the module to a source of power and may provide optical manipulation of light emitted from the light-emitting elements. The light-emitting module according to the present invention comprises a heat dissipation element, a substrate for example a metal core printed circuit board (MCPCB), or FR4 board which is coupled to one or more light-emitting elements and provides a means for operative connection of the light-emitting elements to a source of power. The substrate is positioned such that it is thermally coupled to the heat dissipation element. The light-emitting module further comprises a housing element which matingly connects with the heat dissipation element, wherein the housing element may further comprise an optical element integrated therein for manipulation of the light generated by the one or more light-emitting elements.

One or more light-emitting elements are typically mounted on top of the substrate, which is thermally conductive and in thermal contact with the heat dissipation element. Heat generated by the light-emitting elements can thus be carried from the light-emitting elements through the substrate to the heat dissipation element. Additional components, for example, components enabling control of the current supplied to the light-emitting elements, for example transistors and resistors, may also be mounted on the substrate. Electrically conductive paths within the substrate, or external conductive paths for example wire-bonds or circuit traces, can provide electrical connection between various components on the substrate and provide a means for electrical connection of these components to a source of power. The substrate further comprises a connection mechanism that enables solder-less electrical connections to be made between the substrate and a cable system that is adapted for connection to a source of power. The housing element further includes a fastening system to secure the various components of the light-emitting module together. Each of the heat dissipation element, substrate and housing element can be modularly formed, thereby enabling interchangability of these components, thereby providing versatility to the light-emitting module.

In one embodiment of the present invention, an optical element is associated with the housing element and may be in the form of a lens, for example, and can enable a desired level of manipulation of the light emitted from the light-emitting elements. For example, the light may be dispersed, focused or redirected by the optical element to achieve a particular illumination effect. Different optical elements with different optical characteristics may be used for manipulation of the light emitted by the light-emitting elements, as would be readily understood. In one embodiment, the optical element can be readily interchanged or replaced to meet desired lighting requirements. Furthermore, the optical element can be structurally integrated into the housing element, or separable and connectable to the housing element, for example.

The light-emitting module according to the present invention is further configured to provide the ability to create a lighting system comprising multiple light-emitting modules through the interconnection of two or more light-emitting modules. For example, a number of light-emitting modules can be connected in series to the same cable system thereby creating a string of light-emitting modules. This cable system can additionally be used to mechanically couple the light-emitting modules together. The cable system can be configured in order that the light-emitting modules may be mounted at any point along the cable system, thereby providing flexibility in the spacing between the light-emitting modules.

In one embodiment, the light-emitting modules are mechanically mounted to various receiving means or mounting system such as a track, or similar structure as would be readily understood. Where the light-emitting modules are mounted to a track, for example, the track may be attached to various structures such as the inside back wall of a canopy, or any other surface as would be readily understood. Alternately, the light-emitting modules can be mounted at a desired location by fastening means. The fastening means can be mechanical fasteners for example, screws, bolts rivets or the like, magnetic mounting systems, adhesives for example, pressure sensitive tape, glue or epoxy or the like, or other forms of fastening means as would be readily understood by a worker skilled in the art.

The light-emitting module according to the present invention further protects the light-emitting elements and other components enclosed between the housing element and the heat dissipation element from environmental conditions. A number of sealing technologies can protect, to various degrees, the cavity between the heat dissipation element and the housing element from penetrating particles, dust, gas, liquids. In one embodiment, the light-emitting module can be configured to protect the light-emitting elements and other components within the cavity from external electromagnetic fields.

FIG. 1 illustrates the light-emitting side of a light-emitting module according to one embodiment of the present invention. FIG. 1 shows an assembled light-emitting module 30 comprising a housing element 40, a heat sink 300, a substrate 50 (visible through the housing), and a light-emitting element 315 (visible through the housing). The light-emitting module 30 is attached to a cable system 10 such that an electrical connection is made between the cable system and the light-emitting module.

In one embodiment of the present invention the connection means between the substrate 50 and cable system 10 comprises insulation displacement connectors (IDCs), and the cables are configured as IDC ribbon cables. When the cable is inserted in the IDC connectors, the IDC connectors displace some of the insulation around the electrical conductors, or wires, within the cable in order to make an electrical connection between the substrate and the conducting wires. Other techniques of obtaining a solder-less connection between the cable system and the light-emitting modules according to the present invention may also be used.

Figure 2:
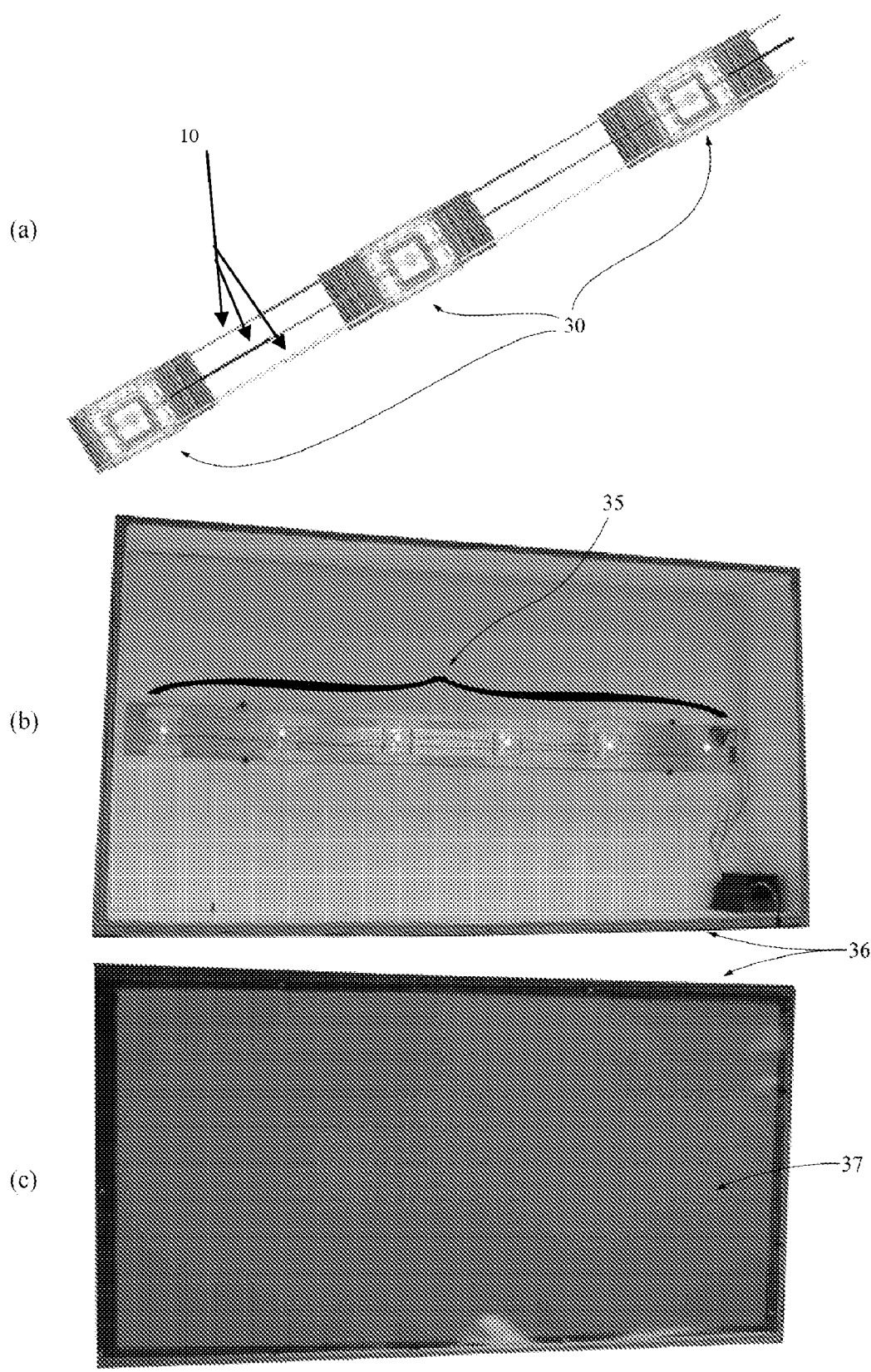
FIG. 2a illustrates three light-emitting modules according to one embodiment of the present invention coupled together.
FIG. 2b illustrates a string of light-emitting modules according to an embodiment of the present invention, mounted to an inside surface of a sign.
FIG. 2c illustrates the sign of FIG. 2b with its front face optic in place.

FIG. 2a illustrates three light-emitting modules 30 connected to a cable system 10 which provides access to a source of power (not shown). As would be readily understood, lighting systems with various light-emitting module arrangements may be achieved by connecting desired numbers of light-emitting modules in any combination of series and/or parallel configurations. In one embodiment of the present invention, the cable system is configured to provide structural support to the light-emitting modules such that each module can maintain its position relative to the other modules without external support. Alternately, the cable system can be flexible wherein additional structural support by a support system can be provided to maintain the position of the light-emitting modules relative to each other.

For example, as in a back lit fascia of a retail store, a string of light-emitting modules according to the present invention may be snapped into a track mounted to the inside back wall of a canopy with selected predetermined optical elements associated with the housing being employed to manipulate the light from the light-emitting elements in order to achieve a desired illumination effect. Alternately, the same string of light-emitting modules may be individually mounted in a channel letter, wherein the flexibility of the cable system, for example, can allow the string of light-emitting modules to conform to different letter shapes. In one embodiment, the cable system may be pliable such that it may be bent into a particular shape under the effect of an external force and can maintain its shape and position when the force is no longer applied thus maintaining the position of the light-emitting modules relative to each other.

FIG. 2b illustrates a string 35 of light-emitting modules according to an embodiment of the present invention mounted to an inside surface of a sign 36 with an open front face. FIG. 2c illustrates the sign 36 with its front face 37 in place.

In one embodiment of the present invention, optical elements can be selected based on the distance between the front face of the channel letter and the light-emitting modules or the modules location within the channel letter, for example.

Figure 3:
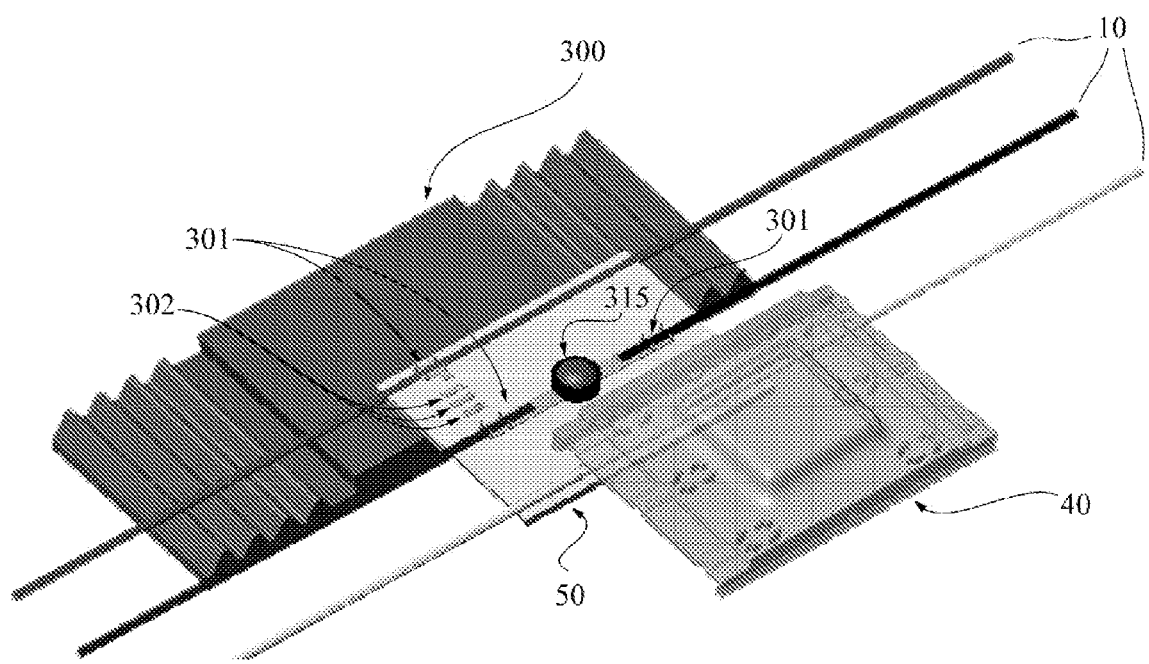
FIG. 3 illustrates an exploded view of the light-emitting module according to FIG. 1.

FIG. 3 illustrates an exploded view of the light-emitting module illustrated in FIG. 1 with the substrate 50 attached to a cable system 10. As illustrated, a light-emitting element 315 is attached to the substrate 50 however more than one light-emitting element may be mounted to the substrate as would be readily understood.

FIG. 3 additionally illustrates a sequence in which an embodiment of the light-emitting module may be assembled. The cable system 10 can be connected to the substrate at positions 301 by IDC connectors, for example. Additional components may also be attached to the substrate via substrate connection means 302 such as bond pads, connectors, or other connection means as would be readily understood. The housing element can subsequently be coupled to the heat dissipation element thereby sealing the substrate there between.

As illustrated in FIG. 3, the light-emitting module can be assembled in a relatively easy manner, and further can provide a means for relatively easy replacement or repair of the module components. This configuration of the light-emitting module can further provide a mean for versatility of the light-emitting module based on the elemental configuration thereof for ease of changing of the components, for example changing of a housing element.

Heat Dissipation Element

In one embodiment of the present invention, as illustrated in FIG. 1, the heat dissipation element may be a heat sink formed from a thermally conductive material such as aluminium, ceramic or other thermally conductive material as would be readily understood by a worker skilled in the art. The passive heat dissipation capabilities through thermal convection, radiation, or conductance of this format of heat dissipation element may be enhanced by measures such as increasing the surface area through which heat dissipation occurs. For example, in the embodiment of FIG. 1 and FIG. 3, the heat sink 300 can be seen to have a corrugated structure for increasing the surface area of the heat sink in contact with the environment for enhancing dissipation of heat to the environment. In addition, anodizing and darkening the surface of the heat sink, for example, can enhance convection and radiation cooling in air, liquid, or solid environments.

In one embodiment of the present invention, the heat dissipation element can be formed by extrusion thereof.

In one embodiment of the present invention, closed or open loop multi-phase cooling mechanisms such as heat pipes or thermosyphons for example, may be employed for further heat dissipation, wherein these cooling mechanisms can be thermally coupled to the light-emitting module.

In another embodiment, active cooling measures can be thermally coupled to the light-emitting module wherein these active cooling measures can comprise forced convection or electro-thermal cooling mechanisms such as employed in Peltier Coolers.

In one embodiment of the present invention, the heat dissipation element of the light-emitting module can be connected to a secondary heat dissipation system or heat bath at a low temperature which can enhance the dissipation capabilities of the heat dissipation element.

Housing Element and Sealing Means

The housing element comprises fastening means to secure the various components of the light-emitting module together as well optionally providing support to the cable system. An optical element can further be coupled to the housing element to enable manipulation of light generated by the light-emitting elements. In some embodiments, the housing unit may provide no manipulation of light if so desired.

Figure 4:
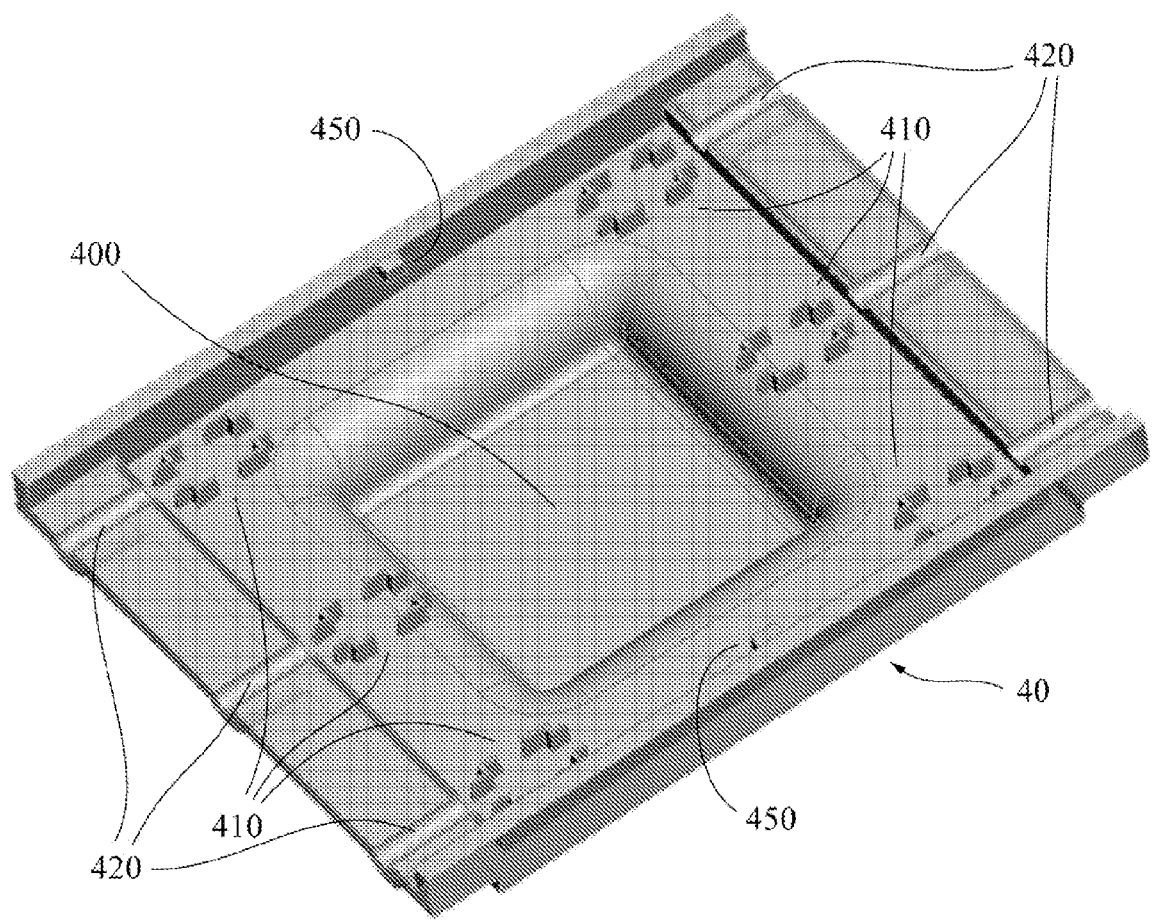
FIG. 4 illustrates a housing element according to one embodiment of the present invention.

A back view of the housing element 40 according to the embodiment of FIG. 1 and FIG. 3 is illustrated in FIG. 4. The housing element 40 can comprise an optical or lenticular element 400 which may be customized in accordance with the light-emitting characteristics and the arrangement of one or more light-emitting elements in the light-emitting module. The optical or lenticular element 400 enables the light-emitting module to provide a desired light radiation pattern when in operation.

In one embodiment, the housing may be made of a material which has a degree of flexibility such that under a controlled applied mechanical force, the housing assumes a strained shape and its fastening means 450 can assume a position which enables the housing to be slid over the heat dissipation element 300. Upon removal of the force the housing element can assume its unstrained shape, thereby causing the fastening elements to clutch the heat dissipation element and secure a releasable connection between the housing element and the heat dissipation element. The housing element may be made by any process and of any material that ensures the foregoing functionality as would be readily understood by a worker skilled in the art.

In one embodiment, this connection between the housing element and the heat dissipation element can additionally apply pressure to the substrate, which is inlayed between the housing element and the heat dissipation element, such that the substrate is pressed against the heat dissipation element thereby establishing a desired level of thermal contact between the heat dissipation element and the substrate. Furthermore, this kind of attachment mechanism can be employed, for example, to press a sealing means such as glue or epoxy, for example, between the housing element and heat dissipation element, such that when assembled the cavity between the housing element and the heat dissipation element is sealed from environmental conditions. As would be readily understood, the sealing means may comprise various technologies such as pre-fabricated interchangeable seals in various shapes made of materials such as natural or synthetic rubber, gasket material or directly applied removable or irremovable sealant substances, or temporarily or permanently malleable sealant substances.

In one embodiment of the present invention, the housing comprises one or more optical elements for manipulation of the light generated by the light-emitting elements of the light-emitting module. An optical element may be of any type, shape and size, as would be readily understood and can be selected based on the desired manipulation of the light generated by the light-emitting elements. An optical element can be a reflective, refractive, diffractive, diffusive, holographic optical element or other format of optical element as would be readily understood. For example, the optical element can be a diffuser, lenticular element, Fresnel array, a lens or any other desired format of optical element which can manipulate the light generated by the light-emitting elements of the light-emitting module.

In one embodiment, the optical element can be formed as a separate component and can be coupled to the housing element. The optical element can be configured to be permanently or releasably coupled to the housing element.

In an alternate embodiment, the housing element and one or more optical elements may be integrally formed as a single unit and fabricated from the same material.

In one embodiment of the present invention, the housing element comprises any combination of extending or indenting support elements 410 and guide elements 420 for alignment of the cable system 10 relative to the light-emitting module. These support elements and/or guide elements can provide a means for avoiding undesired relocation of the wires or cables of the cable system which may cause interference between the wires and the optical performance of the light-emitting module.

Substrate

The substrate can be configured from a variety of different board technologies including a MCPCB, FR4 board or other type of board known to a worker skilled in the art, which can provide thermally conductivity between the one or more light-emitting elements and the heat dissipation element.

In embodiment of the present invention, thermal conductivity between the substrate and the heat dissipation element can be enhanced by a thermally conductive material for example a thermal epoxy or thermal grease.

Components including light-emitting elements as well as any additional components that may be required for driving and controlling the one or more light-emitting elements of the light-emitting module can be mounted on the substrate. As would be readily understood, the components including light-emitting elements, resistors, capacitors, transistors, and leads, for example, may be coupled to various surfaces of the substrate using different technologies. For example, a Surface Mount Technology or other technology may be used to mount components to an MCPCB. In one embodiment of the present invention, these components may be wholly or partially embedded within the substrate.

Figure 5:
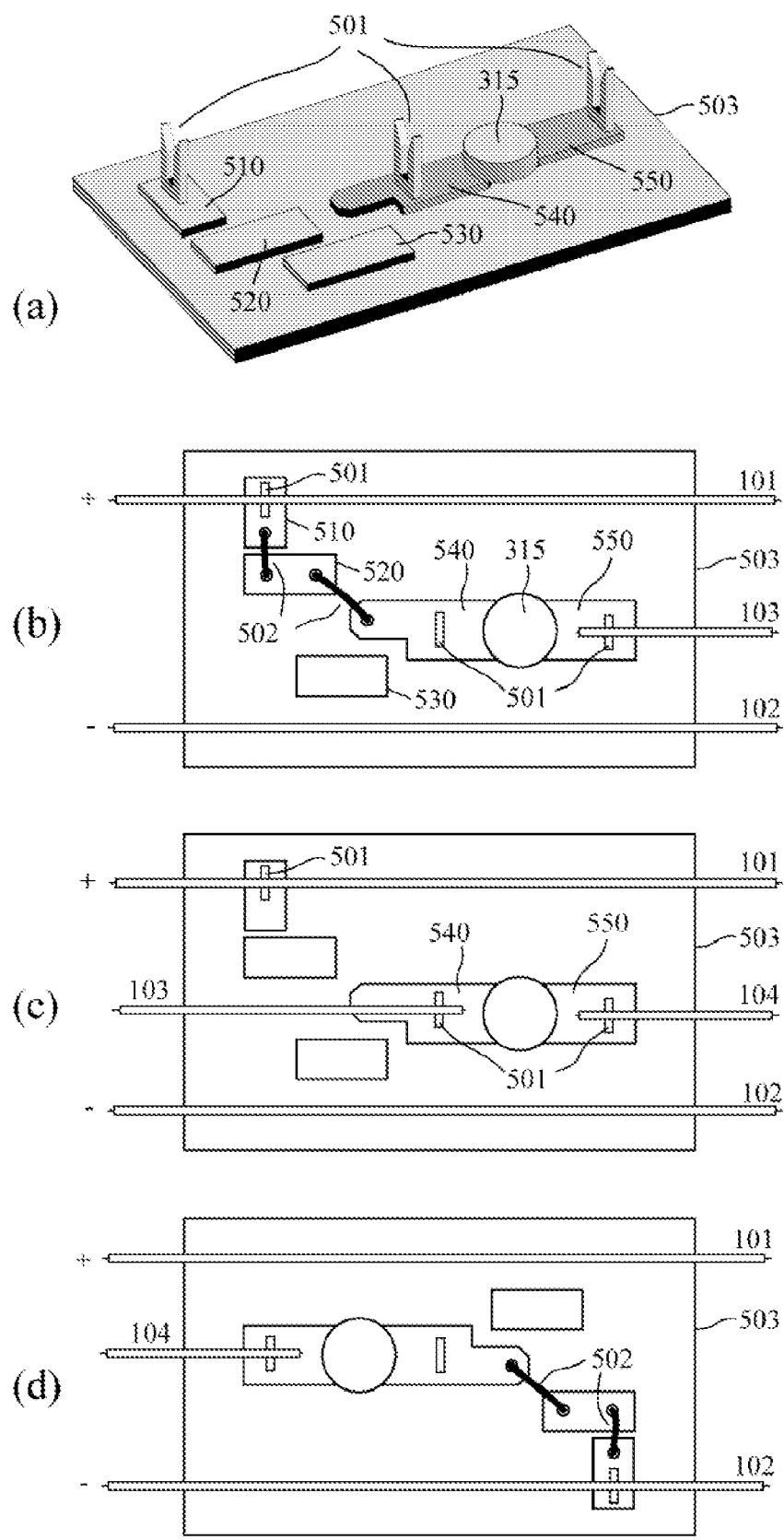
FIG. 5a illustrates a perspective view of a substrate according to one embodiment of the present invention.
FIG. 5b illustrates the substrate of FIG. 5a with a starter-board configuration.
FIG. 5c illustrates the substrate of FIG. 5a with a mid-board configuration.
FIG. 5d illustrates the substrate of FIG. 5a with an end-board configuration.

A perspective view of an embodiment of a substrate 503 to which a light-emitting element 315, IDC's 501 and substrate connection means 510, 520, 530, 540 and 550 are attached is illustrated in FIG. 5a. The substrate 503 can be a MCPCB, for example, which can be thermally connected to the heat dissipation element. Various components, for example, for control of the electric current supplied to light-emitting element 315 may be attached to the substrate via substrate connectors 510, 520, 530, 540 or 550. Each component may also be connected to a combination of substrate connectors 510, 520, 530, 540 or 550. Light-emitting element 315 is electrically connected between substrate connection means 540 and 550. Each of IDCs 501 is individually electrically connected to substrate connection means 510, 540, and 550. Substrate connection means may include bond pads, for example or any other means as would be readily understood. Electrically conductive paths within and/or fabricated on the substrate are used to connect the various components on the board in desired configurations. Each IDC can receive a wire of predetermined cross sectional dimension and establish an electrical contact by displacing the wire's insulation and by firmly attaching to the conductive core of the wire.

In one embodiment of the present invention light-emitting modules can be connected in series to a source of power using a cable system 10. The substrate design of each light-emitting module may be generic, or the configuration of the component on a substrate can be custom wired in a number of different configurations.

In one embodiment of the present invention, the substrate of the first light-emitting module in a series may have a different configuration of components associated therewith than that of the last light-emitting module which may be different from that of a middle light-emitting module. The differing configuration of the components associate with a substrate can depend on the required characteristics of that particular light-emitting module.

A starter-board configuration, mid-board configuration and end-board configuration according to one embodiment of the present invention are illustrated in FIG. 5b, FIG. 5c and FIG. 5d, respectively. The substrate wiring 502 of the starter-board and the end-board configurations can be the same and the wired substrates can be used interchangeably provided that each substrate is connected to the cable system as illustrated in FIGS. 5b and 5d. In the starter-board configuration, one terminal of the light-emitting element 315 is connected to cable 101 which is connected to the positive terminal of a power supply (not shown). The other terminal of the light-emitting element 315 on the starter-board is connected to cable 103 which connects to the light-emitting element 315 of a substrate with a mid-board configuration. Assuming a string comprising three light-emitting modules, cable 104 connects the other terminal of the light-emitting element 315 on the mid-board to one terminal of the light-emitting element on the end-board. The other terminal of the light-emitting element on the end-board is then connected to cable 102 which is connected to the negative terminal of the power supply. Therefore, the light-emitting elements on each of the starter-board, mid-board and end-board as described are connected in series.

Various multiples and arrangements of light-emitting modules according to the present invention may be connected in series and/or parallel configurations. The light-emitting elements on each substrate can further be wired in series and/or parallel.

For example, in one embodiment of the present invention a number of light-emitting modules each comprise one light-emitting element and can be connected in series with each of the substrates configured such that the light-emitting element on each substrate is wired in parallel with each other. In this embodiment, one terminal of each light-emitting element is electrically connected to a single cable which is connected to the positive terminal of a source of power, for example, and the other terminal of the light-emitting elements is connected to another single cable connected to the negative terminal of the source of power, for example.

In other embodiments of the present invention, more than one light-emitting element may be present on the substrate of a light-emitting module. Therefore, as would be readily understood, various multiples and configurations of the electrical connection of the light-emitting modules and light-emitting elements can be formed as would be readily understood by a worker skilled in the art.

In other embodiments of the present invention the cable system interconnecting a string of light-emitting modules can be configured such that the cable system comprises varying numbers of wires in order to provide a desired level of functionality to each of the light-emitting modules in the string.

For example in one embodiment, the cable system comprises two wires, namely a negative and positive wire configuration. In another embodiment of the present invention, the cable system comprise three wires, for example, a three wire configuration can enable a final stage driver to be configured to provide control signals to five light-emitting modules formed into a string.

Alternate light-emitting module configurations and the required cable system for the interconnection thereof would be readily understood by a worker skilled in the art.

It is obvious that the foregoing embodiments of the invention are exemplary and can be varied in many ways. Such present or future variations are not to be regarded as a departure from the spirit and scope of the invention, and all such modifications as would be obvious to one skilled in the art are intended to be included within the scope of the following claims.

I claim:

1. A light-emitting module comprising:
   (a) a thermally conductive substrate having one or more light-emitting elements thermally connected thereto, the substrate configured to operatively couple a source of power to the one or more light-emitting elements, thereby providing a means for activation of the one or more light-emitting elements;
   (b) a heat dissipation element thermally coupled to the thermally conductive substrate; and
   (c) a housing element including fastening means for detachably coupling the housing element to the heat dissipation element, said substrate being enclosed between the heat dissipation element and said housing element, said housing element including a transparent region enabling transmission of light emitted by the one or more light-emitting elements therethrough.

2. The light-emitting module according to claim 1 further comprising one or more optical elements for manipulation of the light emitted by said one or more light-emitting elements, said optical element optically coupled to said housing element.

3. The light-emitting module according to claim 2, wherein the one or more optical elements and the housing element are integrally formed.

4. The light-emitting module according to claim 2, wherein the optical element is a reflective element, refractive element, diffractive element, diffusive element or holographic element.

5. The light-emitting module according to claim 4, wherein the optical element is a diffuser, lenticular element, Fresnel array or lens.

6. The light-emitting module according to claim 1, wherein the substrate is configured to operatively couple a source of power to the one or more light-emitting elements using solderless connections.

7. The light-emitting module according to claim 6, wherein the solderless connections are insulation displacement connectors.

8. The light-emitting module according to claim 1, wherein the substrate is a metal core printed circuit board or a FR4 board.

9. The light-emitting module according to claim 1, wherein the substrate includes internal electrical conductive paths.

10. The light-emitting module according to claim 1, wherein the substrate includes circuit traces forming electrical conductive paths.

11. The light-emitting module according to claim 1, wherein the housing element is formed from flexible material for releasably connecting to the heat dissipation element.

12. The light-emitting module according to claim 1, wherein a sealant substance is positioned between the housing element and the heat dissipation element for environmental sealing between the housing element and the heat dissipation element.

13. The light-emitting module according to claim 1, wherein the heat dissipation element is configured for thermal connection to a heat pipe or a thermosyphon.

14. The light-emitting module according to claim 1, wherein the heat dissipation element is configured for thermal connection to a heat dissipation system.

15. The light-emitting module according to claim 14, wherein the heat dissipation system is a forced convection mechanism, electro-cooling mechanism or a low temperature heat bath.

* * * * *